(12) United States Patent
Chen et al.

(10) Patent No.: US 11,635,849 B1
(45) Date of Patent: Apr. 25, 2023

(54) FINGERPRINT SIGNAL PROCESSING SYSTEM AND FINGERPRINT SIGNAL PROCESSING METHOD

(71) Applicant: IMAGE MATCH DESIGN INC., Zhubei (TW)

(72) Inventors: Zheng-Xiong Chen, Zhubei (TW); Sun-How Jiang, Zhubei (TW)

(73) Assignee: IMAGE MATCH DESIGN INC., Zhubei (TW)

( * ) Notice: Subject to any disclaimer, the term of this patent is extended or adjusted under 35 U.S.C. 154(b) by 64 days.

(21) Appl. No.: 17/508,453

(22) Filed: Oct. 22, 2021

(51) Int. Cl.
*G06F 3/041* (2006.01)
*H03M 1/10* (2006.01)
*H03M 1/12* (2006.01)

(52) U.S. Cl.
CPC ........ *G06F 3/0418* (2013.01); *G06F 3/04164* (2019.05); *H03M 1/1023* (2013.01); *H03M 1/1205* (2013.01)

(58) Field of Classification Search
CPC G06F 3/0418; G06F 3/04164; H03M 1/1023; H03M 1/1205
See application file for complete search history.

(56) References Cited

U.S. PATENT DOCUMENTS

| | | | |
|---|---|---|---|
| 9,397,680 B2 * | 7/2016 | Xu | H03M 1/1061 |
| 11,128,311 B1 * | 9/2021 | Chang | H03M 1/0658 |
| 2020/0134285 A1 * | 4/2020 | Hung | G06F 3/0416 |

* cited by examiner

*Primary Examiner* — Giovanni Astacio-Oquendo
*Assistant Examiner* — Zannatul Ferdous
(74) *Attorney, Agent, or Firm* — Sinorica Patent & Trademark Office

(57) ABSTRACT

A fingerprint signal processing system for a fingerprint sensor includes a calibration control circuit, a register circuit, a decode circuit and a normalization circuit. The calibration control circuit is configured to receive a background calibration control signal and an image signal from the fingerprint sensor, and convert the image signal into a plurality of digital signals according to a plurality of offsets. When the background calibration control signal is at a high level, the calibration control circuit is configured to read a plurality of calibration parameters from the register circuit.

22 Claims, 7 Drawing Sheets

FINGERPRINT SIGNAL PROCESSING SYSTEM AND FINGERPRINT SIGNAL PROCESSING METHOD

1. FIELD OF THE INVENTION

The present invention relates a signal processing circuit and a signal processing method, particularly to a fingerprint signal processing system and a fingerprint signal processing method.

2. DESCRIPTION OF THE PRIOR ART

The fingerprint recognition technology has been extensively applied to various electronic products, such as mobile phones, notebook computers, tablet computers, and portable electronic devices, for verifying identities. In the technical architecture of a fingerprint sensor, offsets always occur after an analog-to-digital converter (ADC) converts the analog fingerprint data into a digital signal. In the conventional technology, algorithms are used to evaluate and calibrate the offsets. However, the conventional technology is likely to slow down the fingerprint data pickup speed. Therefore, the conventional needs improving.

SUMMARY OF THE INVENTION

A fingerprint signal processing system and a fingerprint signal processing method are provided to calibrate offsets during encoding instead of using an algorithm with software, which increases the fingerprint data pickup speed.

A fingerprint signal processing system and a fingerprint signal processing method are provided to use a target value and the first bit of each column of the encoded image data to form a row signal, whereby the background signal will not drift away and be controlled to a rational value.

The fingerprint signal processing system and the fingerprint signal processing method solve an issue that the conventional technology performs calibration through the algorithms executed by software and thus slows down the fingerprint data pickup speed. Firstly, the calibration parameters stored in the register circuit are read through a route; the calibration parameters are used to calibrate the offsets of ADCs; the average value of each row of pixels is calculated, and the averages are used to calibrate the offsets generated during decoding without using any algorithm. Thereby, the fingerprint data pickup speed is increased. Further, the present invention uses the peaks and troughs of the pixel signals to calculate the average value of the pixel signals. In comparison with the conventional method of calculating the average value, the method of the present invention is more accurate and less likely to be affected by the area pressed by the fingerprint.

According to the abovementioned objectives and principles, the present invention provides a fingerprint signal processing system for a fingerprint sensor, which includes a background calibration control circuit receiving a background calibration control signal, receiving an encoded analog signal from the fingerprint sensor, and converting the encoded analog signal into a plurality of digital signals, wherein the encoded analog signal is a piece of primitive image data read by the fingerprint sensor; a register circuit electrically connected with the calibration control circuit and storing the digital signals, wherein the digital signals are stored in form of a 2D matrix, and wherein the first row of the 2D matrix includes a plurality of calibration parameters, and wherein while the background calibration control signal is at a high level, the calibration control circuit reads the plurality of calibration parameters CAL from the register circuit to update a plurality of offsets of the digital signals; and a decode circuit electrically connected with the register circuit and converting the digital signals into a plurality of pixel signals.

In one embodiment, the fingerprint signal processing system further comprises a normalization circuit, which is electrically connected with the decode circuit and used to normalize the pixel signals for generating a plurality of normalized pixel signals.

In one embodiment, the calibration control circuit further comprises a plurality of analog-to-digital converters (ADCs), which receives the encoded analog signal and respectively converts the encoded analog signal into the plurality of digital signals according to the corresponding offsets; and an offset calibration circuit, which is electrically connected with the analog-to-digital converters, receives the background calibration control signal, a target parameter (TAR) and the calibration parameters, wherein while the background calibration control signal is at the high level, the offset calibration circuit updates the offsets to generate amended offsets according to the target parameter, the calibration parameters, or a combination thereof.

In one embodiment, while the background calibration control signal is at a low level, the offsets are the offsets occurring before update or the offsets occurring after amendment.

In one embodiment, the fingerprint signal processing system further comprising a route, which is electrically connected with the calibration control circuit and the register circuit.

In one embodiment, the calibration control circuit reads the calibration parameters stored in the register circuit through the route, wherein each of the calibration parameters is an average value of one corresponding column of the primitive image data.

In one embodiment, an encoded signal of the register circuit is an N×M matrix, wherein both N and M are natural numbers; the decode circuit generates the pixel signals of the N×M matrix. Each column of the N×M matrix includes N pieces of pixel signals. The normalization circuit works out a pixel average value of the N pieces of pixel signals corresponding to each column and respectively subtracts the average pixel value from the N pieces of pixel signals to generate N pieces of normalized pixel signals, wherein the average pixel value is calculated according to less than the N pieces of the pixel signals.

In one embodiment, the average pixel value of the column is obtained via averaging an optimized peak pixel signal and an optimized trough pixel signal. The amplitude difference of the optimized peak pixel signal and a base value of the pixel signals of the column is greater than the amplitude difference of another pixel signal of the column to the base value. The amplitude difference of the optimized trough pixel signal and the base value of the pixel signals of the column is smaller than the amplitude difference of another pixel signal of the column to the base value.

In one embodiment, the average pixel value of the column is obtained via averaging an optimized peak pixel signal and an optimized trough pixel signal. The optimized peak pixel signal is an average of a maximum pixel signal, which has a greatest amplitude difference to a base value of the pixel signals, and at least a portion of the other pixel signals. The optimized trough pixel signal is an average of a minimum pixel signal, which has a smallest amplitude difference to the base value of the pixel signals, and at least a portion of the other pixel signals.

The present invention also provides a fingerprint signal processing method for a fingerprint sensor, which includes steps: receiving an analog signal from the fingerprint sensor; converting the analog signal into a plurality of digital signals; converting the digital signals into a plurality of pixel signals; and normalizing the pixel signals to generate a plurality of normalized pixel signals, wherein the pixel signals are in form of an N×M matrix; both N and M are natural numbers; each column of pixel signals includes N pieces of pixel signals. The normalization step further comprises steps: calculating the average pixel value of each column, wherein the pixel average value is obtained according to less than the N pieces of the pixel signals; subtracting the average pixel value from the N pieces of pixel signals corresponding to the column to generate N pieces of normalized pixel signals.

In one embodiment, the step of calculating the average pixel value includes steps: obtaining a base value of the N pieces of pixel signals corresponding to the column; obtaining a minimum pixel signal having a largest amplitude difference to the base value; obtaining a maximum pixel signal having a smallest amplitude difference to the base value; averaging the minimum pixel signal and the maximum pixel signal to obtain the average pixel value.

In one embodiment, the step of calculating the average pixel value includes steps: obtaining a base value of the N pieces of pixel signals corresponding to the column; obtaining a minimum pixel signal having a largest amplitude difference to the base value; obtaining a maximum pixel signal having a smallest amplitude difference to the base value; and averaging the minimum pixel signal and the maximum pixel signal to obtain the average pixel value.

In one embodiment, the step of calculating the average pixel value includes steps: obtaining a base value of the N pieces of pixel signals corresponding to the column; obtaining a minimum pixel signal having a greatest amplitude difference to the base value and a portion of the pixel signals, which neighbor the minimum pixel signal, and averaging the minimum pixel signal and the pixel signals neighboring the minimum pixel signal to obtain an average trough; obtaining a maximum pixel signal having a smallest amplitude difference to the base value and a portion of the pixel signals, which neighbor the maximum pixel signal, and averaging the maximum pixel signal and the pixel signals neighboring the maximum pixel signal to obtain an average peak; and averaging the average trough and the average peak to obtain the average pixel value.

In one embodiment, the step of calculating the average pixel value includes steps: obtaining a base value of the N pieces of pixel signals corresponding to the column; obtaining a minimum pixel signal having a greatest amplitude difference to the base value and at least one pixel signal having an amplitude difference less than the greatest amplitude difference to the base value, and averaging the minimum pixel signal and the at least one pixel signal having an amplitude difference less than the greatest amplitude difference to obtain an average trough; obtaining a maximum pixel signal having a smallest amplitude difference to the base value and at least one pixel signal having an amplitude difference larger than the smallest amplitude difference to the base value, and averaging the maximum pixel signal and the at least one pixel signal having an amplitude difference larger than the smallest amplitude difference to obtain an average peak; and averaging the average trough and the average peak to obtain the average pixel value.

The present invention further provides another fingerprint signal processing method for a fingerprint sensor, which comprises steps: using a calibration control circuit to receive a background calibration control signal, and receive an analog signal from the fingerprint sensor, and convert the analog signal into a plurality of digital signals; using a register circuit to store the plurality of digital signals; and using a decode circuit to convert the plurality of digital signals into a plurality of pixel signals, wherein while the background calibration control signal is at a high level, the calibration control circuit reads a plurality of calibration parameters from the register circuit to update a plurality of offsets of the digital signals.

In one embodiment, the fingerprint signal processing method further comprises steps: using a plurality of analog-to-digital converters to receive the analog signal and convert the analog signal into the plurality of digital signals according to the corresponding offsets; and using an offset calibration circuit to receive the background calibration control signal, a target parameter and the plurality of calibration parameters, wherein while the background calibration control signal is at a high level, the offset calibration circuit updates the offsets according to the target parameter, the plurality of calibration parameters or a combination thereof for generating the amended offsets.

In one embodiment, while the background calibration control signal is at a low level, the offsets are offsets occurring before update or after amend.

In one embodiment, the fingerprint signal processing method further comprises a step: using a normalization circuit to normalize the plurality of pixel signals for generating a plurality of normalized pixel signals, wherein the plurality of pixel signals is in form of an N×M matrix; both N and M are natural numbers; each column of pixel signals includes N pieces of pixel signals; the step of normalizing the plurality of pixel signals includes steps: calculating an average pixel value of each column, wherein the average pixel value is calculated according to less than the N pieces of pixel signals; and subtracting the average pixel value from the N pieces of pixel signals corresponding to the column to generate N pieces of normalized pixel signals.

DESCRIPTION OF THE PREFERRED EMBODIMENT

Figure 1:
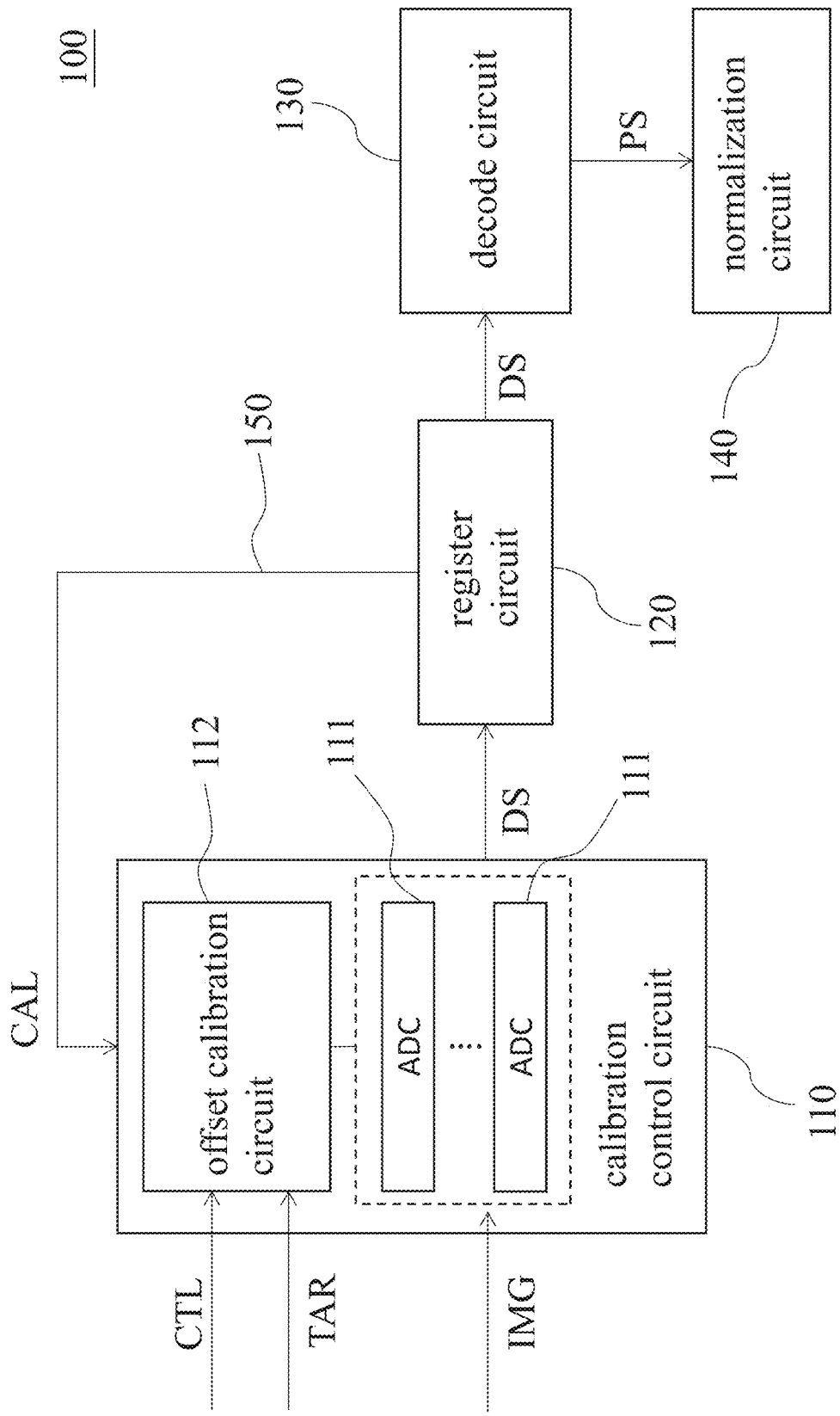
FIG. 1 is a diagram schematically showing a first fingerprint signal processing system according to some embodiments of the present invention.

Below, embodiments are used to demonstrate the present invention. However, these embodiments are only to exemplify the present invention but not to limit the scope of the present invention. In other words, the application of the present invention is not limited to the special environments mentioned in the embodiments. It should be explained herein: the elements, which are not directly related to the present invention, are not depicted but omitted in the drawings; the relative sizes of the elements in the drawings are only for convenient comprehension but not to limit the practical dimensions of the elements.

Refer to FIG. 1, which is a diagram schematically showing a first fingerprint signal processing system 100 according to some embodiments of the present invention. The fingerprint signal processing system 100 includes a calibration control circuit 110, a register circuit 120, a decode circuit 130 and a normalization circuit 140. The register circuit 120 is electrically connected with the calibration control circuit 110 and the decode circuit 130. The decode circuit 130 is electrically connected with the normalization circuit 140. In this embodiment, the fingerprint signal processing system 100 may be a single integrated circuit (IC), at least a portion of an Application Specific Integrated Circuit (ASIC) or at least a portion of a module or package integrating wires, active elements, passive elements, IC and ASIC. The register circuit 120 may be a memory able to store data.

Refer to FIG. 1 again. The fingerprint signal processing system 100 is connected with the fingerprint sensor (not shown in the drawings) and receives analog signals (IMG) from the fingerprint sensor. In this embodiment, the fingerprint sensor is exemplified by a fingerprint sensor with encoding, such as a Glass Sensor Encoder (GSE). Thus, the analog signal (IMG) is an encoded signal. For example, the fingerprint sensor with encoding function transforms the original signals into encoded analog signals IMG. Refer to following Table 1 and Table 2. Suppose that the original signal is 4×4 image data shown in Table. 1, a 4×4 encoded image data shown in Table 2 is generated after the fingerprint sensor encodes the original signal of 4×4 image data. In the encoded image data shown in Table 2, Y00 is generated by averaging X00, X10, X20 and X30; Y01 is generated by averaging X01, X11, X21 and X31; Y02 is generated by averaging X02, X12, X22 and X32; Y03 is generated by averaging X03, X13, X23 and X33. Thus, in the encoded image data, the first bit of each column is the average of all data in the corresponding column of the original image data, but an encoding method by the fingerprint sensor is not limited herein. The present invention uses the signal of the first row consisting of the encoded data Y00, Y01, Y02 and Y03 in Table 2 to calibrate analog offsets. It is easily understood: while the original signal is 16×16 image data, the signal of the first row of the encoded data includes Y00, Y01. Y02, . . . , Y0E and Y0F.

TABLE 1

| X00 | X01 | X02 | X03 |
|---|---|---|---|
| X10 | X11 | X12 | X13 |
| X20 | X21 | X22 | X23 |
| X30 | X31 | X32 | X33 |

TABLE 2

| Y00 | Y01 | Y02 | Y03 |
|---|---|---|---|
| Y10 | Y11 | Y12 | Y13 |
| Y20 | Y21 | Y22 | Y23 |
| Y30 | Y31 | Y32 | Y33 |

Refer to FIG. 1 again. In this embodiment, the calibration control circuit 110 includes a plurality of analog-to-digital converters (ADCs) 111 and an offset calibration circuit 112. The offset calibration circuit 112 is electrically connected with the ADCs 111. The ADCs 111 receive the analog signal (IMG). The offset calibration circuit 112 receives a background calibration control signal CTL, a target parameter TAR and a calibration parameter CAL. The fingerprint signal processing system 100 further includes a route 150 that is electrically connected with the offset calibration circuit 112 and the register circuit 120. In this embodiment, the offset calibration circuit 112 reads the calibration parameter CAL stored in the register circuit 120 via the route 150.

Figure 2:
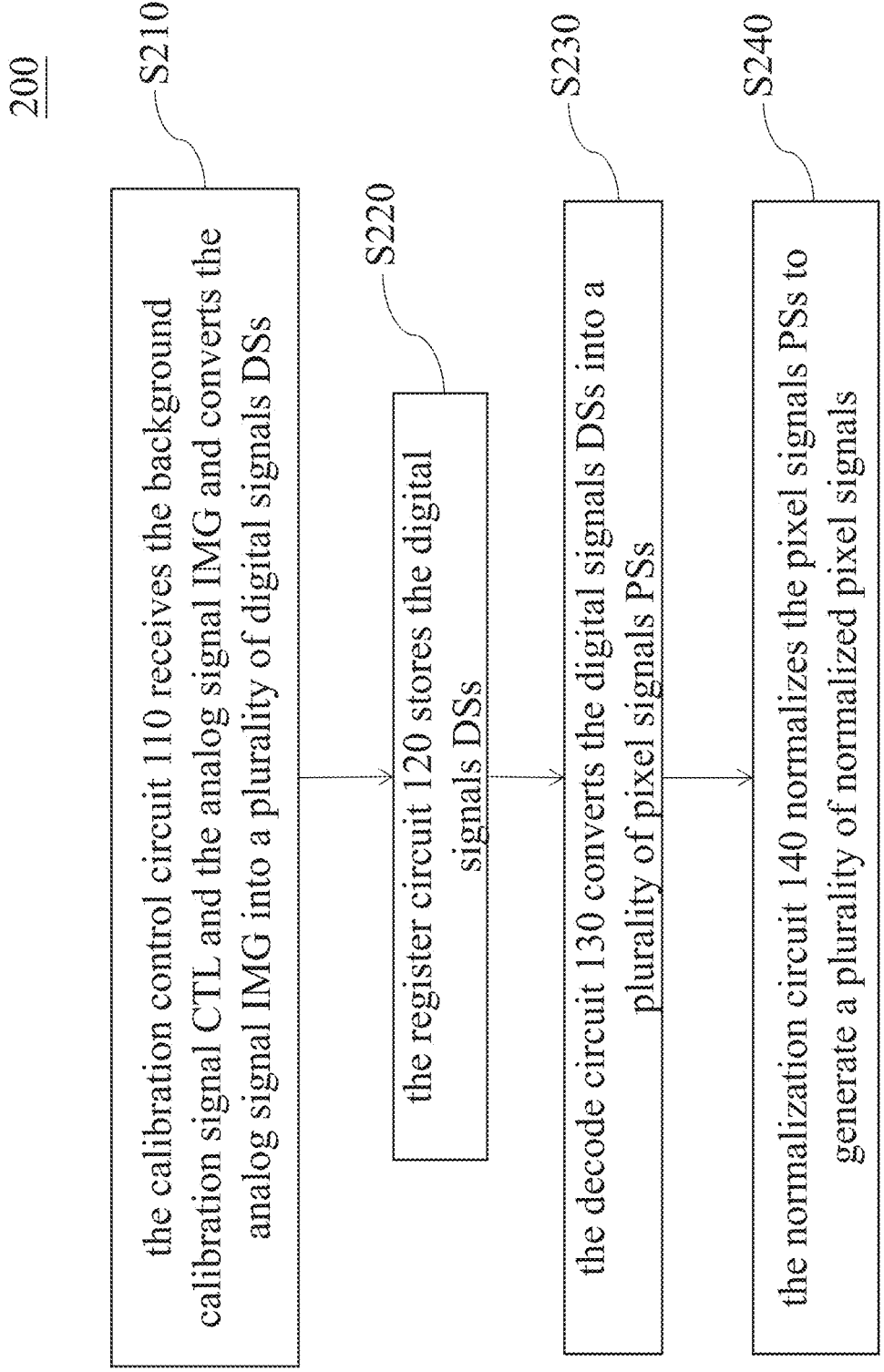
FIG. 2 is a flowchart of a first fingerprint signal processing method according to some embodiments of the present invention.
Figure 3:
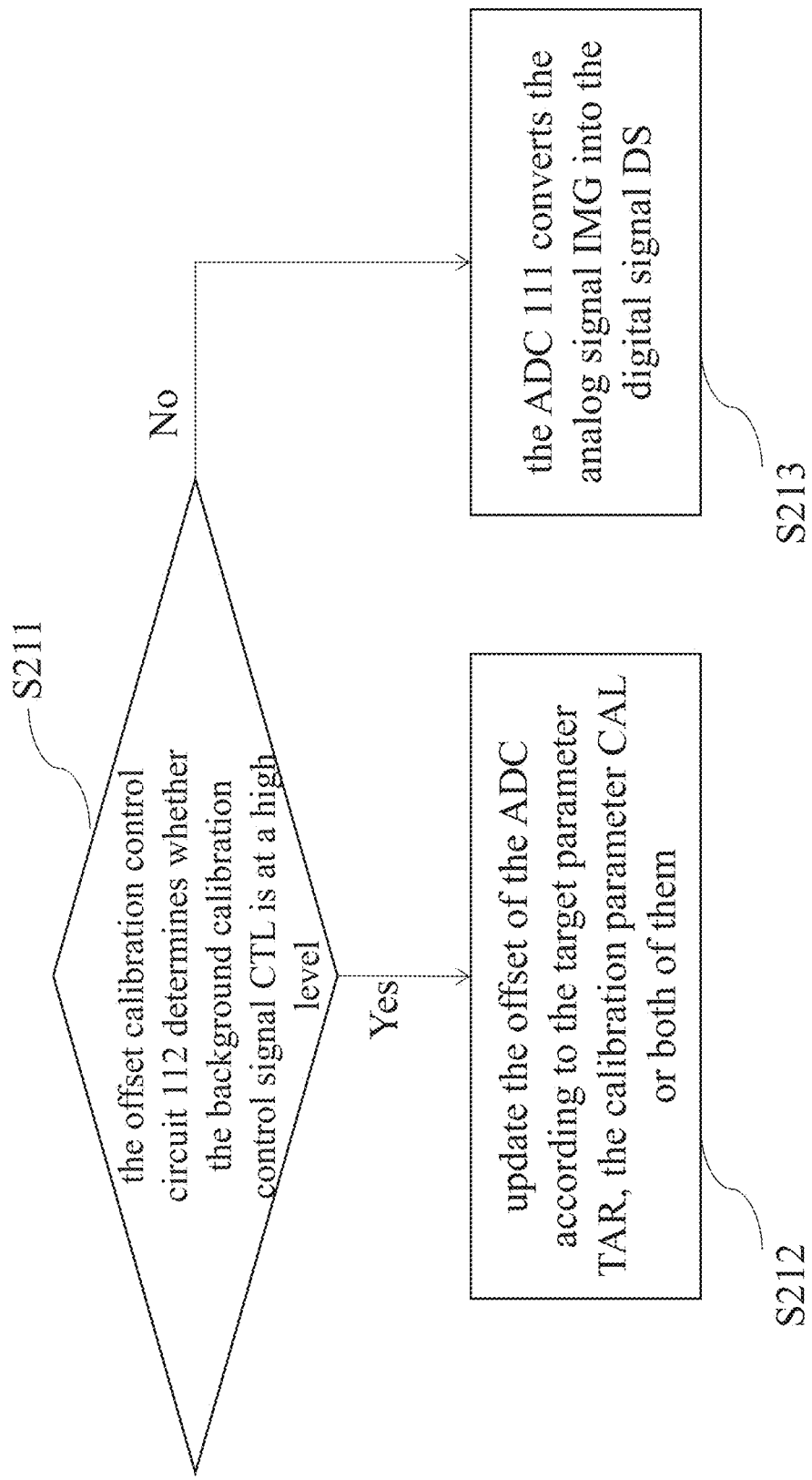
FIG. 3 is a flowchart of Step S210 according to some embodiments of the present invention.

Refer to FIG. 2, which shows a flowchart of a first fingerprint signal processing method 200 according to some embodiments of the present invention. Also refer to FIG. 1 again. In one embodiment, the fingerprint signal processing method 200 shown in FIG. 2 is applicable to the fingerprint signal processing system 100 shown in FIG. 1. In Step S210, the calibration control circuit 110 receives the background calibration signal CTL and receives the analog signal IMG from the fingerprint sensor; the calibration control signal 110 converts the analog signal IMG into a plurality of digital signals DSs. Next, in Step S220, the register circuit 120 stores the digital signals DSs. In this embodiment, Step S210 may include Steps S211-S213. FIG. 3 shows a flowchart of Step S210 according to some embodiments of the present invention. Refer to FIGS. 1-3 simultaneously. In Step S211, the offset calibration control circuit 112 determines whether the background calibration control signal CTL is at a high level; in the case of the background calibration control signal CTL at a high level indicates that entering a background calibration mode is requested, and Step S212 will be executed. In Step S212, the offset of the ADC will be updated according to the target parameter TAR, the calibration parameter CAL or both of them. For example, the amended offset of the digital signal is generated by compensation method. In one embodiment, the difference of the target parameter and the calibration parameter is used to form the amended offset to compensate the offset of the ADC. In this embodiment, while the background calibration control signal CTL is at a high level, the offset calibration circuit 112 is used to read the calibration parameters (i.e. the average values of the columns Y00, Y01, . . . and so on) stored in the register circuit 120 through the route 150, and the calibration parameters CAL are used to calibrate the offsets of the ADCs.

Refer to FIGS. 1-3 once again. Normally, the ADC is calibrated in booting. Therefore, the firmware enables the background calibration signal CTL in booting, and the offset calibration circuit 112 calibrates the offset according to the primitive digital signal DS. The offset calibration circuit 112 reads the first row of digital signals of an encoded matrix (2D matrix) as the calibration parameters CAL for calibrating the offsets of a plurality of ADCs 111. It should be noted: the register circuit 120 is formed by M pieces of memory arrays each containing N pieces of storage units, wherein both M and N are natural numbers, and N is 256 bytes. Thus, the first row of digital signals are referred to the digital signals DSs stored in the first row of memory arrays, and the digital signals of the first row have M bytes. As mentioned above, in the offset calibration circuit 112, the first row of digital signals consists of the average values of the primitive signals in which each average is the average of the pre-encode signals X in a column (i.e. X00, X10 in Table 1). As ones in Table. 1 and Table. 2, the post-encode image data Y00 is the average of X00, X10, X20 and X30; Y01 is the average of X01, X11, X21 and X31; the other post-encode image data are generated in the same principle. Therefore, the digital signals DSs (Y00, Y01, Y02 . . . ) of the first row of memory arrays are worked out according to the averages of the pre-encode pixel signals of each column, naturally reflecting the pre-encode background averages of each column. Therefore, the digital signals DSs of the first row of memory arrays may function as the calibration parameters CAL, and the average of the digital signals DSs of each column may be used to calibrate the offset of each ADC 111.

Refer to FIGS. 1-3 again. The target parameter TAR is used to modify the brightness of the image background. For example, the calibrated offset may be obtained via multiplying the difference of the target parameter TAR and the calibration parameter CAL with a ratio (such as 1/4 or another ratio). While the calibration parameter CAL is iteratively updated via persistently scanning the picture, the calibration parameter CAL will be gradually close to the target parameter TAR to mean the average that represents the background image is approaching the target parameter TAR.

Refer to FIGS. 1-3 again. In Step S211, if the offset calibration circuit 112 determines that the background calibration control signal CTL is at a low level, which means the system may be in a fingerprint reading mode or a fingerprint pressing mode instead of executing a background calibration mode. Next, the process proceeds to Step S213. In Step S213, the offset of the ADC 111 keeps unchanged. In other words, the ADC 111 converts the analog signal IMG into the digital signal DS according to the offset generated in the last cycle of background calibration or the self-owned offset of the ADC 111 (if background calibration is not performed in booting). In this embodiment, while the background calibration signal CTL is at a low level, the system does not compensate the offset of the ADC 111. For example, while the system is reading a fingerprint, the firmware may disable the background calibration control signal CTL; however, the offset of the ADC 111 has been calibrated in booting; thus, the ADC 111 will convert the analog signal IMG into the digital signal DS according to the offset that has been calibrated in booting.

Refer to FIGS. 1-3 again. In Step S230, the decode circuit 130 converts the digital signals DSs into a plurality of pixel signals PSs. In Step S210, according to existed offset of the offset calibration circuit 112, the ADC 111 converts the analog signal coming from the fingerprint sensor into digital signals DSs. Next, in Step S230, the decode circuit 130 converts the digital signals DSs into pixel signals PSs using the decode array. The digital signals DSs stored in the first row of the memory array are regarded as zeros or abandoned. The data stored in the first byte of each column may be distorted because of the oversaturation caused by the blasting average value while the finger is touching the sensor. Thus, the pixel signal PS will have an offset after decoding. Therefore, the fingerprint signal processing method 200 of the present invention further executes Step S240, wherein the normalization circuit 140 normalizes the pixel signals PSs to generate a plurality of normalized pixel signals. In this embodiment, the pixel signals PSs are in form of an N×M matrix, wherein both N and M are natural numbers. In an example that N equals 256, the average value of the pixel signals PSs of each column is calculated, wherein each column of pixel signals PSs include 256 pieces of pixel signals PSs; the average value of the pixel signals PSs is subtracted from the 256 pieces of pixel signals PSs to generate 256 pieces of normalized pixel signals. In this embodiment, the pixel average value is worked out according to the maximum pixel signal and the minimum pixel signal of the 256 pieces of pixel signals PSs. Besides, while the background calibration is not performed, the offset provided by the offset calibration circuit may be the digital initial offset "0".

Figure 4:
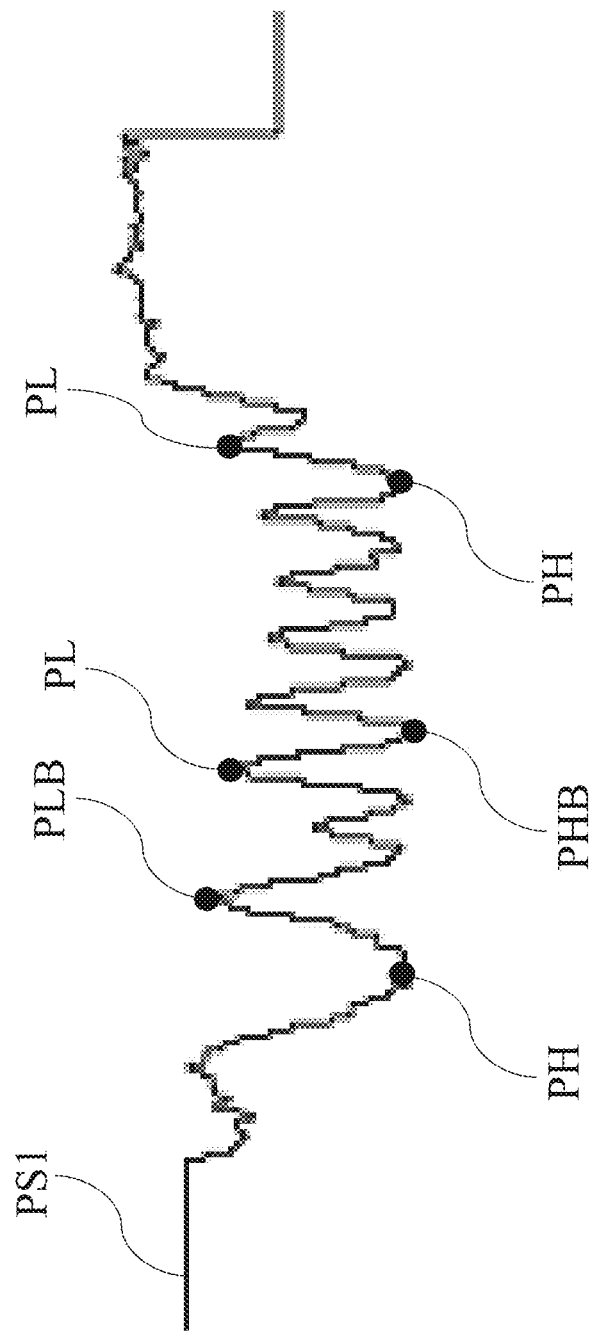
FIG. 4 is a diagram schematically showing a column of pixel signals according to some embodiments of the present invention.

Refer to FIG. 4, which is a diagram schematically showing a column of pixel signals according to some embodiments of the present invention. As shown in FIG. 4, a column of pixel signals includes a plurality of peaks PH, a plurality of troughs PL and a base value PS1 of digital current (DC) initial values. The normalization method is to find out the optimized peak PHB (i.e. the minimum pixel signal where the amplitude difference of the peak PH and the base value PS1 is maximum) and find out the optimized trough PLB (i.e. the maximum pixel signal where the amplitude difference of the trough PL and the base value PS1 is minimum). The average value of the column of the pixel signals is obtained via dividing the sum of the minimum pixel signal represented by the optimized peak PHB and the maximum pixel signal represented by the optimized trough PLB by two. Next, N pieces of normalized pixel signals are obtained via subtracting the pixel average value from the N pieces of pixel signals. Thereby, the offset generated in decoding can be calibrated. It should be noted: while the normalized pixel signals are generated, they may be transmitted to the fingerprint recognition algorithm to function as the input signals of the algorithm.

Refer to FIG. 4 again. A first method of obtaining the average value of the pixel signals has been mentioned above, wherein the average value of the pixel signals is obtained via dividing the sum of the minimum pixel signal and the maximum pixel signal by 2. A second method of obtaining the average value of the pixel signals includes steps: sampling and summing a plurality of troughs PL and dividing the sum by the sampling number to obtain a first average value; sampling and summing a plurality of peaks PH and dividing the sum by the sampling number to obtain a second average value; averaging the first average value and the second average value to obtain the average value of the pixel signals, wherein the plurality of troughs PL includes the optimized trough PLB, and the plurality of peaks PH includes the optimized peak PHB, and wherein the total sampling number is less than the total number of the peaks and troughs of a column of pixel signals. For example, in a column of pixel signals, the top five pixel signals (the troughs PL having the last five amplitude differences to the base value PS1) are sampled and averaged to obtain an average trough; the last five pixel signals (the peaks having the top five amplitude differences to the base value PS1) are sampled and averaged to obtain an average peak; the average trough and the average peak are divided by 2 to obtain the average value of the pixel signals of the present invention. In this example, the top five pixel signals include the optimized trough PLB and have a numerical order in the magnitudes of the amplitude differences; the last five pixel signals include the optimized peak PHB and have a numerical order in the magnitudes of the amplitude differences. In another example of the second method, the sampling number of the peaks PH and the sampling number of the troughs PL may be identical or different. Firstly, acquire the average of the optimized trough PLB and one or several troughs PL neighboring the optimized trough PLB to function an average trough. Next, acquire the average of the optimized peak PHB and one or several peaks PH neighboring the optimized trough PHB to function an average peak. Then, calculate the average value of the average trough and the average peak to function as the average value of the pixel signals, which is to be used in normalization. In the abovementioned example, the plurality of sampled troughs PL includes the optimized trough PLB and the troughs having positional relativity with the optimized trough PLB; the plurality of sampled peaks PH includes the optimized peak PHB and the peaks having positional relativity with the optimized peak PHB.

Figure 5:
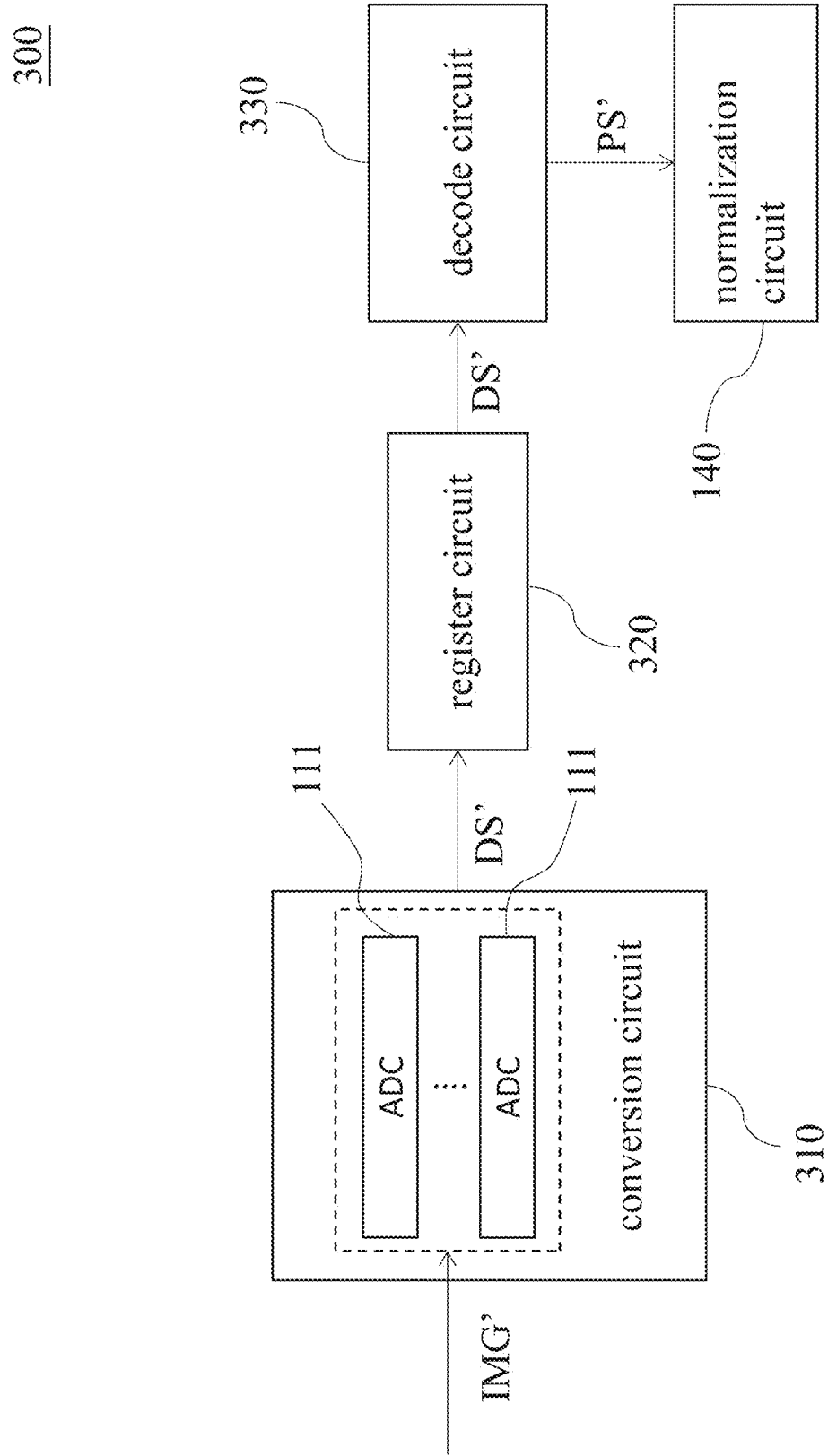
FIG. 5 is a diagram schematically showing a second fingerprint signal processing system according to some embodiments of the present invention.

FIG. 5 is a diagram schematically showing a second fingerprint signal processing system according to some embodiments of the present invention. Refer to FIG. 1 and FIG. 5. The fingerprint signal processing system 300 of the present invention includes a conversion circuit 310, a register circuit 320, a decode circuit 330 and a normalization circuit 140. The fingerprint signal processing system 300 is connected with a fingerprint sensor (not shown in FIG. 1) and receives an analog signal IMG' from the fingerprint sensor, wherein the analog signal IMG' may be a non-encoded signal. ADCs 111 of the conversion circuit 310 perform analog-to-digital conversion to convert the analog signals IMG' into digital signals DS's. The digital signals DS's are transmitted to the register circuit 320 for storage. The decode circuit 330 converts the digital signals DS' into pixel signals PS's using a decode matrix. The normalization circuit 140 normalizes the pixel signals PS's to generate a plurality of normalized pixel signals.

Figure 6:
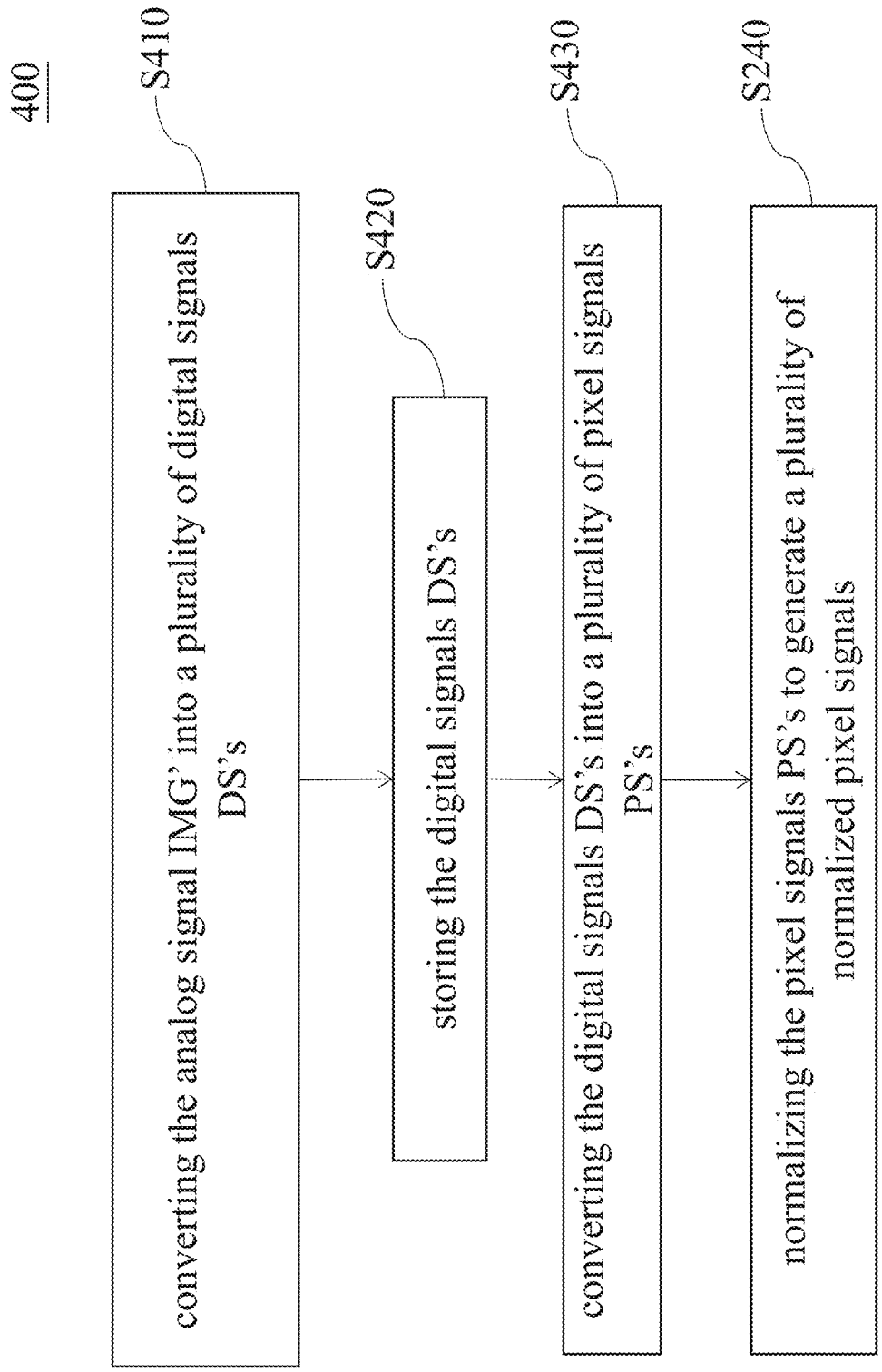
FIG. 6 is a flowchart of a second fingerprint signal processing method according to some embodiments of the present invention.

FIG. 6 is a flowchart of a second fingerprint signal processing method according to some embodiments of the present invention. The system shown in FIG. 5 may be realized by the flowchart shown in FIG. 6. Refer to FIG. 6. The fingerprint signal processing method 400 may be executed by a single IC or an IC package of the fingerprint signal processing system 300. In Step S410, the conversion circuit 310 receives the analog signal IMG' and converts the analog signal IMG' into a plurality of digital signals DS's. Next, in Step S420, the register circuit 320 stores the digital signals DS's. Next, in Step S430, the decode circuit 330 converts the digital signals DS's into a plurality of pixel signals PS's. In the register circuit 320, the digital signals DS's stored in the first row of the memory arrays will be regarded as zeros or abandoned. Next, in Step S240, the normalization circuit 140 normalizes the pixel signals PS's to generate a plurality of normalized pixel signals.

Figure 7:
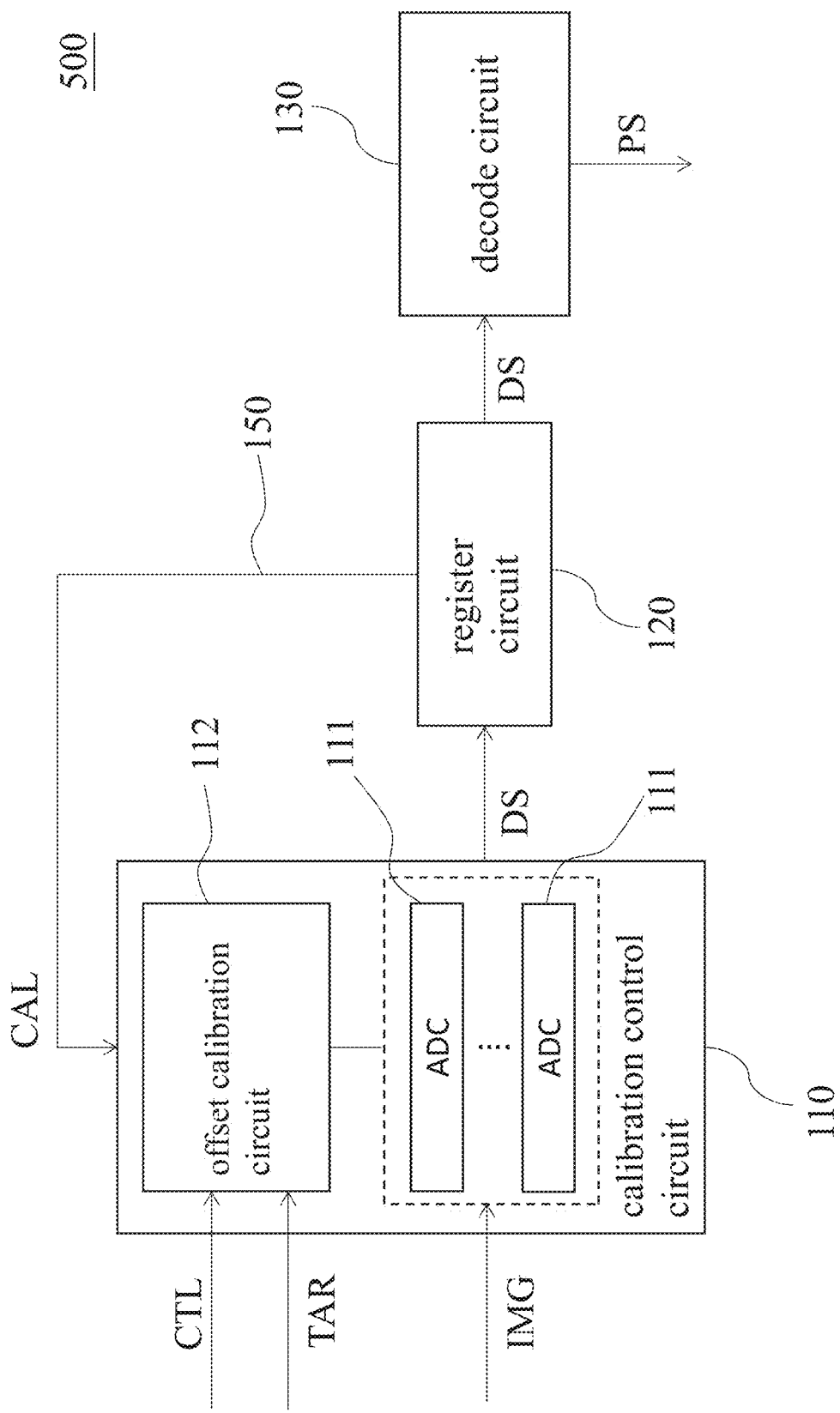
FIG. 7 is a diagram schematically showing a third fingerprint signal processing system according to some embodiments of the present invention.

It should be explained: the fingerprint signal processing system shown in FIG. 1 may be designed to be free of the normalization circuit 140 but directly transmit the pixel signals PSs to the rear-end algorithm, as shown in FIG. 7. In other words, the fingerprint signal processing system 500 performs background calibration. Therefore, the fingerprint signal processing system 500 only needs Step S210-Step S230. It is easily understood: the circuits of the abovementioned systems of the present invention may be realized by semiconductor structures through semiconductor fabrication processes.

From the abovementioned embodiments, it is learned: the present invention is primarily to overcome the problem that the speed of picking up fingerprint data is slowed down by the conventional technology that uses the algorithm to perform judgement and calibration. The present invention is characterized in reading the calibration parameters stored in the register circuit through the route; using the calibration parameters to calibrate the offsets of ADCs; and calculating the average value of each row of pixels to calibrate the offset generated in decoding without using the algorithm to perform calibration. Thus, the present invention can increase the speed of picking up fingerprint data. Further, the present invention features using the peaks and troughs of the pixel signals to calculate the average value of the pixel signals. In comparison with the conventional method of calculating the average value, the method of the present invention is able to obtain more accurate results and less likely to be affected by the area pressed by the fingerprint.

The exemplary steps are illustrated above in sequence. However, these steps are not necessarily executed in the mentioned sequence in the present invention. The methods executing the steps in different sequence are still included by the scope of the present invention. The embodiments having steps added, replaced, changed and/or omitted or having sequence varied may be still within the scope of the present invention without departing from the spirit of the present invention.

The present invention has been disclosed above with embodiments. However, these embodiments are only to exemplify the present invention but not to limit the scope of the present invention. Any person skilled in the art should be able to modify or vary these embodiments without departing from the spirit of the present invention. Therefore, any modification or variation according to the spirit of the present invention is to be also included by the scope of the present invention, which is dependent on the claims stated below.

What is claimed is:

1. A fingerprint signal processing system for a fingerprint sensor, comprising:
 a calibration control circuit, receiving a background calibration control signal, receiving an encoded analog signal from the fingerprint sensor, and converting the encoded analog signal into a plurality of digital signals, wherein the encoded analog signal is a piece of primitive image data read by the fingerprint sensor;
 a register circuit, electrically connected with the calibration control circuit and storing the digital signals, wherein the digital signals are stored in form of a 2-dimensional matrix; a first row of the 2-dimensional matrix includes a plurality of calibration parameters; while the background calibration control signal is at a high level, the calibration control circuit reads the plurality of calibration parameters from the register circuit to update a plurality of offsets of the plurality of digital signals; and
 a decode circuit electrically connected with the register circuit and used to convert the plurality of digital signals into a plurality of pixel signals.

2. The fingerprint signal processing system according to claim 1 further comprising a normalization circuit electrically connected with the decode circuit and used to normalize the plurality of pixel signals for generating a plurality of normalized pixel signals.

3. The fingerprint signal processing system according to claim 2, wherein an encoded signal of the register circuit is an N×M matrix; both N and M are natural numbers; the encode circuit generates the pixel signals of the N×M matrix; each column of the N×M matrix includes N pieces of pixel signals; the normalization circuit calculates an pixel average value of the N pieces of pixel signals of each column and subtracts the pixel average value from the N pieces of pixel signals to generate N pieces of normalized pixel signals; the pixel average value is worked out according to less than N pieces of pixel signals.

4. The fingerprint signal processing system according to claim 3, wherein the pixel average value is obtained via averaging an optimized peak pixel signal and an optimized trough pixel signal of the corresponding N pieces of pixel signals; an amplitude difference of the optimized peak pixel signal to a base value of the pixel signals of the column is greater than the amplitude difference of another pixel signal of the column to the base value; the amplitude difference of the optimized trough pixel signal to the base value is smaller than the amplitude difference of another pixel signal of the column to the base value.

5. The fingerprint signal processing system according to claim 3, wherein:
the pixel average value is obtained via averaging an optimized peak pixel signal and an optimized trough pixel signal of the corresponding N pieces of pixel signals;
the optimized peak pixel signal at least includes an average of a maximum pixel signal having a maximum amplitude difference to a base value of the pixel signals of the column and other of the pixel signals; and
the optimized trough pixel signal at least includes an average of a minimum pixel signal having a minimum amplitude difference to a base value of the pixel signals of the column and other of the pixel signals.

6. The fingerprint signal processing system according to claim 2, wherein the calibration control circuit includes:
a plurality of analog-to-digital converters, used to receive the analog signal, wherein the plurality of analog-to-digital converters respectively converts the analog signal into the plurality of digital signals according to the corresponding offsets; and
an offset calibration circuit electrically connected with the plurality of analog-to-digital converters and receiving the background calibration control signal, a target parameter and the plurality of calibration parameters, wherein while the background calibration control signal is at the high level, the offset calibration circuit update the offsets according to the target parameter, the plurality of calibration parameters or a combination thereof for generating offsets that are amended.

7. The fingerprint signal processing system according to claim 1, wherein the calibration control circuit includes:
a plurality of analog-to-digital converters, used to receive the encoded analog signal, wherein the plurality of analog-to-digital converters respectively converts the encoded analog signal into the plurality of digital signals according to the corresponding offsets; and
an offset calibration circuit electrically connected with the plurality of analog-to-digital converters and receiving the background calibration control signal, a target parameter and the plurality of calibration parameters, wherein while the background calibration control signal is at the high level, the offset calibration circuit update the offsets according to the target parameter, the plurality of calibration parameters or a combination thereof for generating offsets that are amended.

8. The fingerprint signal processing system according to claim 7, wherein while the background calibration control signal is at a low level, the offsets are offsets before being updated or after being amended.

9. The fingerprint signal processing system according to claim 7 further comprising a route electrically connected with the offset calibration circuit and the register circuit.

10. The fingerprint signal processing system according to claim 9, wherein the offset calibration reads the plurality of calibration parameters stored in the register circuit; each of the plurality of calibration parameters is an average value of each column of data of the primitive image data.

11. A fingerprint signal processing method for a fingerprint sensor, comprising steps:
receiving an analog signal from the fingerprint sensor, and converting the analog signal into a plurality of digital signals;
converting the plurality of digital signals into a plurality of pixel signals; and
normalizing the plurality of pixel signals to generate a plurality of normalized pixel signals, wherein the pixel signals are in form of an N×M matrix; both N and M are natural numbers; each column of pixel signals includes N pieces of pixel signals; the step of normalizing the plurality of pixel signals includes steps:
calculating an average pixel value of each column, wherein the average pixel value is calculated according to less than N pieces of the pixel signals; and
subtracting the average pixel value from N pieces of the pixel signals to generate N pieces of normalized pixel signals.

12. The fingerprint signal processing method according to claim 11, wherein the step of calculating the average pixel value includes steps:
obtaining a base value of N pieces of pixel signals corresponding to the column;
obtaining a minimum pixel signal having a greatest amplitude difference to the base value;
obtaining a maximum pixel signal having a smallest amplitude difference to the base value; and
averaging the minimum pixel signal and the maximum pixel signal to obtain the average pixel signal.

13. The fingerprint signal processing method according to claim 11, wherein the step of calculating the average pixel value includes steps:
obtaining a base value of N pieces of pixel signals corresponding to the column;
obtaining a minimum pixel signal having a greatest amplitude difference to the base value and a portion of the pixel signals, which neighbor the minimum pixel signal, and averaging the minimum pixel signal and the pixel signals neighboring the minimum pixel signal to obtain an average trough;
obtaining a maximum pixel signal having a smallest amplitude difference to the base value and a portion of the pixel signals, which neighbor the maximum pixel signal, and averaging the maximum pixel signal and the pixel signals neighboring the maximum pixel signal to obtain an average peak; and
averaging the average trough and the average peak to obtain the average pixel value.

14. The fingerprint signal processing method according to claim 11, wherein the step of calculating the average pixel value includes steps:
obtaining a base value of N pieces of pixel signals corresponding to the column;
obtaining a minimum pixel signal having a greatest amplitude difference to the base value and at least one pixel signal having an amplitude difference less than the greatest amplitude difference to the base value, and averaging the minimum pixel signal and the at least one pixel signal having an amplitude difference less than the greatest amplitude difference to obtain an average trough;
obtaining a maximum pixel signal having a smallest amplitude difference to the base value and at least one pixel signal having an amplitude difference larger than the smallest amplitude difference to the base value, and averaging the maximum pixel signal and the at least one pixel signal having an amplitude difference larger than the smallest amplitude difference to obtain an average peak; and averaging the average trough and the average peak to obtain the average pixel value.

15. The fingerprint signal processing method according to claim 14 further comprising a step:

using a normalization circuit to normalize the plurality of pixel signals for generating a plurality of normalized pixel signals, wherein the plurality of pixel signals is in form of an N×M matrix; both N and M are natural numbers; each column of pixel signals includes N pieces of pixel signals; the step of normalizing the plurality of pixel signals includes steps: calculating an average pixel value of each column, wherein the average pixel value is calculated according to less than the N pieces of pixel signals; and subtracting the average pixel value from the N pieces of pixel signals corresponding to the column to generate N pieces of normalized pixel signals.

16. The fingerprint signal processing method according to claim 15, wherein the step of calculating the average pixel value includes steps:

obtaining a base value of N pieces of pixel signals corresponding to the column;

obtaining a minimum pixel signal having a greatest amplitude difference to the base value;

obtaining a maximum pixel signal having a smallest amplitude difference to the base value; and averaging the minimum pixel signal and the maximum pixel signal to obtain the average pixel signal.

17. The fingerprint signal processing method according to claim 15, wherein the step of calculating the average pixel value includes steps:

obtaining a base value of N pieces of pixel signals corresponding to the column;

obtaining a minimum pixel signal having a greatest amplitude difference to the base value and a portion of the pixel signals, which neighbor the minimum pixel signal, and averaging the minimum pixel signal and the pixel signals neighboring the minimum pixel signal to obtain an average trough;

obtaining a maximum pixel signal having a smallest amplitude difference to the base value and a portion of the pixel signals, which neighbor the maximum pixel signal, and averaging the maximum pixel signal and the pixel signals neighboring the maximum pixel signal to obtain an average peak; and averaging the average trough and the average peak to obtain the average pixel value.

18. The fingerprint signal processing method according to claim 15, wherein the step of calculating the average pixel value includes steps:

obtaining a base value of N pieces of pixel signals corresponding to the column;

obtaining a minimum pixel signal having a greatest amplitude difference to the base value and at least one pixel signal having an amplitude difference less than the greatest amplitude difference to the base value, and averaging the minimum pixel signal and the at least one pixel signal having an amplitude difference less than the greatest amplitude difference to obtain an average trough;

obtaining a maximum pixel signal having a smallest amplitude difference to the base value and at least one pixel signal having an amplitude difference larger than the smallest amplitude difference to the base value, and averaging the maximum pixel signal and the at least one pixel signal having an amplitude difference larger than the smallest amplitude difference to obtain an average peak; and averaging the average trough and the average peak to obtain the average pixel value.

19. A fingerprint signal processing method for a fingerprint sensor, comprising steps:

using a calibration control circuit to receive a background calibration control signal, and receive an analog signal from the fingerprint sensor, and convert the analog signal into a plurality of digital signals;

using a register circuit to store the plurality of digital signals; and using a decode circuit to convert the plurality of digital signals into a plurality of pixel signals, wherein while the background calibration control signal is at a high level, the calibration control circuit reads a plurality of calibration parameters from the register circuit to update a plurality of offsets of the digital signals.

20. The fingerprint signal processing method according to claim 19 further comprising steps:

using a plurality of analog-to-digital converters to receive the analog signal and convert the analog signal into the plurality of digital signals according to the corresponding offsets; and using an offset calibration circuit to receive the background calibration control signal, a target parameter and the plurality of calibration parameters, wherein while the background calibration control signal is at the high level, the offset calibration circuit updates the offsets according to the target parameter, the plurality of calibration parameters or a combination thereof for generating the offsets that are amended.

21. The fingerprint signal processing method according to claim 20, wherein while the background calibration control signal is at a low level, the offsets are offsets before update or after amend.

22. The fingerprint signal processing method according to claim 19 further comprising a step:

using the calibration control circuit to read the plurality of calibration parameters stored in the register circuit through a route, wherein original digital signals of each column, which have not been encoded, are averaged to obtain a column average value, and all the average column values are used to form a first row of digital signals.

* * * * *